(12) United States Patent
Nikonov et al.

(10) Patent No.: US 10,885,963 B2
(45) Date of Patent: Jan. 5, 2021

(54) FERROELECTRIC MEMORY-BASED SYNAPSES

(71) Applicant: Intel Corporation, Santa Clara, CA (US)

(72) Inventors: Dmitri Nikonov, Beaverton, OR (US); Ilya Karpov, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/221,175

(22) Filed: Dec. 14, 2018

(65) Prior Publication Data

US 2020/0194049 A1   Jun. 18, 2020

(51) Int. Cl.
*G11C 11/22* (2006.01)
*H01L 27/1159* (2017.01)
*G06N 3/02* (2006.01)
*G11C 11/54* (2006.01)

(52) U.S. Cl.
CPC .............. *G11C 11/223* (2013.01); *G06N 3/02* (2013.01); *G11C 11/2259* (2013.01); *G11C 11/2275* (2013.01); *G11C 11/54* (2013.01); *H01L 27/1159* (2013.01)

(58) Field of Classification Search
None
See application file for complete search history.

(56) References Cited

U.S. PATENT DOCUMENTS

| 2006/0138519 A1* | 6/2006 | Kang | ................. G11C 16/0483 257/314 |
| 2007/0170481 A1* | 7/2007 | Kang | ..................... G11C 11/22 257/295 |
| 2008/0049537 A1* | 2/2008 | Kang | ................... G11C 11/404 365/230.06 |

(Continued)

FOREIGN PATENT DOCUMENTS

| WO | WO2018125024 A1 | 7/2018 |
| WO | WO2019066959 A1 | 4/2019 |

OTHER PUBLICATIONS

Cutress, "Intel and Micron to Dissolve 3D XPoint Partnership after 2019", AnandTech, Jul. 16, 2018, three pages, https://www.anandtech.com/show/13083/intel-and-micron-update-3d-xpoint-roadmap-combined-effort-2nd-gen-3rd-gen-separate.

(Continued)

*Primary Examiner* — J. H. Hur
(74) *Attorney, Agent, or Firm* — Trop, Pruner & Hu, P.C.

(57) ABSTRACT

An embodiment includes an apparatus comprising: a first layer and a second layer; a first gate including first gate portions and a second gate including second gate portions; wherein the first layer: (a) is monolithic, (b) is between the first gate portions and is also between the second gate portions, and (c) includes a semiconductor material; wherein the second layer: (a) is between the first layer and at least one of the first gate portions and is also between the first layer and at least one of the second gate portions, and (b) includes oxygen and at least one of hafnium, silicon, yttrium, zirconium, barium, titanium, lead, or combinations thereof; wherein (a) a first plane intersects the first gate portions and the first and second layers, and (b) a second plane intersects the second gate portions and the first and second layers. Other embodiments are described herein.

20 Claims, 16 Drawing Sheets

(56) References Cited

U.S. PATENT DOCUMENTS

| | | | | |
|---|---|---|---|---|
| 2008/0315294 | A1* | 12/2008 | Walker | G11C 16/10 257/324 |
| 2009/0080250 | A1* | 3/2009 | Nishihara | G11C 11/5628 365/185.03 |
| 2013/0119455 | A1* | 5/2013 | Chen | H01L 27/1157 257/324 |
| 2013/0234101 | A1* | 9/2013 | Sasago | H01L 45/1608 257/4 |
| 2014/0070290 | A1* | 3/2014 | Inumiya | H01L 43/10 257/295 |
| 2015/0179657 | A1* | 6/2015 | Inumiya | H01L 27/11597 257/295 |
| 2016/0118404 | A1* | 4/2016 | Peng | H01L 27/11597 257/295 |
| 2016/0322368 | A1* | 11/2016 | Sun | H01L 27/1159 |
| 2016/0343422 | A1* | 11/2016 | Marotta | G11C 7/067 |
| 2016/0358661 | A1* | 12/2016 | Vali | G06N 3/04 |
| 2018/0122478 | A1 | 5/2018 | Morris et al. | |

OTHER PUBLICATIONS

Micheloni et al., "Architectural and Integration Options for 3D NAND Flash Memories", Computers, Aug. 10, 2017, pp. 1-19, vol. 6 Issue 3, MDPI AG, Basel, Switzerland.

Wikipedia, "Charge trap flash", May 30, 2018, nine pages, https://en.wikipedia.org/wiki/Charge_trap_flash.

Wikipedia, "Thin-film transistor", Jun. 28, 2018, three pages, https://en.wikipedia.org/wiki/Thin-film_transistor.

Wikipedia, "System in package", Jun. 29, 2018, two pages, https://en.wikipedia.org/wiki/System_in_package.

Wikipedia, "Package on package", Jun. 24, 2018, four pages, https://en.wikipedia.org/wiki/Package_on_package.

Wikipedia, "Ferroelectric RAM", Aug. 21, 2018, six pages, https://en.wikipedia.org/wiki/Ferroelectric_RAM.

Wikipedia, "Ferroelectricity", Jul. 1, 2018, seven pages, https://en.wikipedia.org/wiki/Ferroelectricity.

Wikipedia, "Flash memory", Aug. 28, 2018, 23 pages, https://en.wikipedia.org/wiki/Flash_memory.

Das, "Intel's Embedded DRAM: New Era of Cache Memory", EE Times, Aug. 7, 2014, six pages, 2018, UBM Electronics, https://www.eetimes.com/author.asp?doc_id=1323410.

James, "The Confab—Semi Industry is Now Mature", Solid State Technology, Dec. 6, 2013, 49 pages, https://electroiq.com/chipworks_real_chips_blog/author/sdavis/page/3/.

James, "Recent Innovations in DRAM Manufacturing", Conference Paper, Aug. 2010, seven pages, Chipworks, Inc.

Tallis, "Micron 3D NAND Status Update", AnandTech, Feb. 12, 2016, four pages, https://www.anandtech.com/show/10028/micron-3d-nand-status-update.

Sheldon, "NAND flash memory basics: Comparing SLC, MLC and TLC NAND", Tech Target, Nov. 20, 2017, three pages, https://searchstorage.techtarget.com/feature/NAND-flash-memory-basics-Comparing-SLC-MLC-and-TLC-NAND.

Walker, "Samsung's 3D V-NAND Flash Product—The Spires of El Dorado?", 3D InCites, Aug. 12, 2014, two pages, https://www.3dincites.com/2014/08/samsungs-3d-vnand-flash-product-spires-el-dorado/.

Tai et al., "Photosensitivity Analysis of Low-Temperature Poly-Si Thin-Film Transistor Based on the Unit-Lux-Current", IEEE Transactions on Electron Devices, Jan. 2009, pp. 50-56, vol. 56, No. 1, Institute of Electrical and Electronics Engineers.

Alcorn, "WD's Big Advantage: BiCS3 64-Layer 3D NAND Coming This Year", Tom's Hardware, Jul. 26, 2016, three pages, https://www.tomshardware.com/news/wd-sandisk-bics3-64-layer-3d-nand,32328.html.

Polinksy, "Dynamic Random Access Memory—DRAM", Introduction to DRAM Technology, Aug. 28, 2001, 36 pages, Rochester Institute of Technology—Microelectronic Engineering.

Logan, "Understanding the Structure of Neural Networks", Becoming Human: Artificial Intelligence Magazine, Nov. 27, 2017, five pages, https://becominghuman.ai/understanding-the-structure-of-neural-networks-1fa5bd17fef0.

Adam, et al., "Highly-Uniform Multi-Layer ReRAM Crossbar Circuits", 2016, pp. 436-439, Institute of Electrical and Electronics Engineers.

Adam, et al., "3-D Memristor Crossbars for Analog and Neuromorphic Computing Applications", IEEE Transactions on Electron Devices, Jan. 2017, pp. 312-318, vol. 64, No. 1, Institute of Electrical and Electronics Engineers.

* cited by examiner

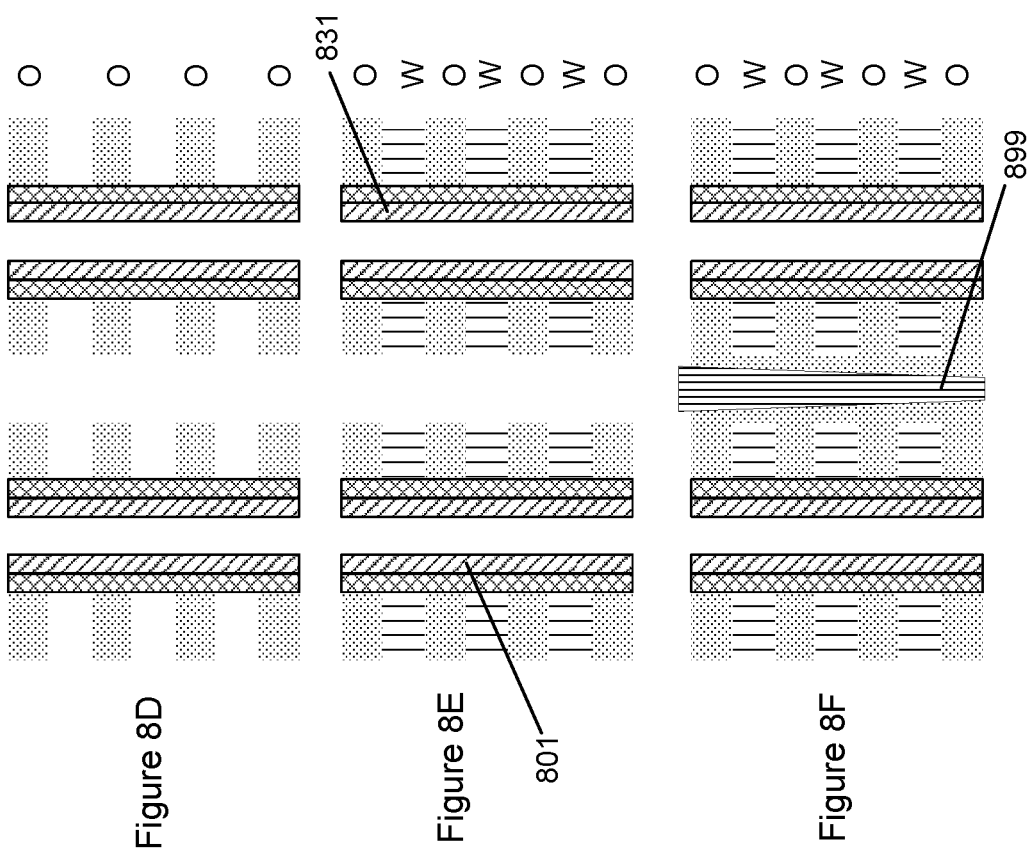
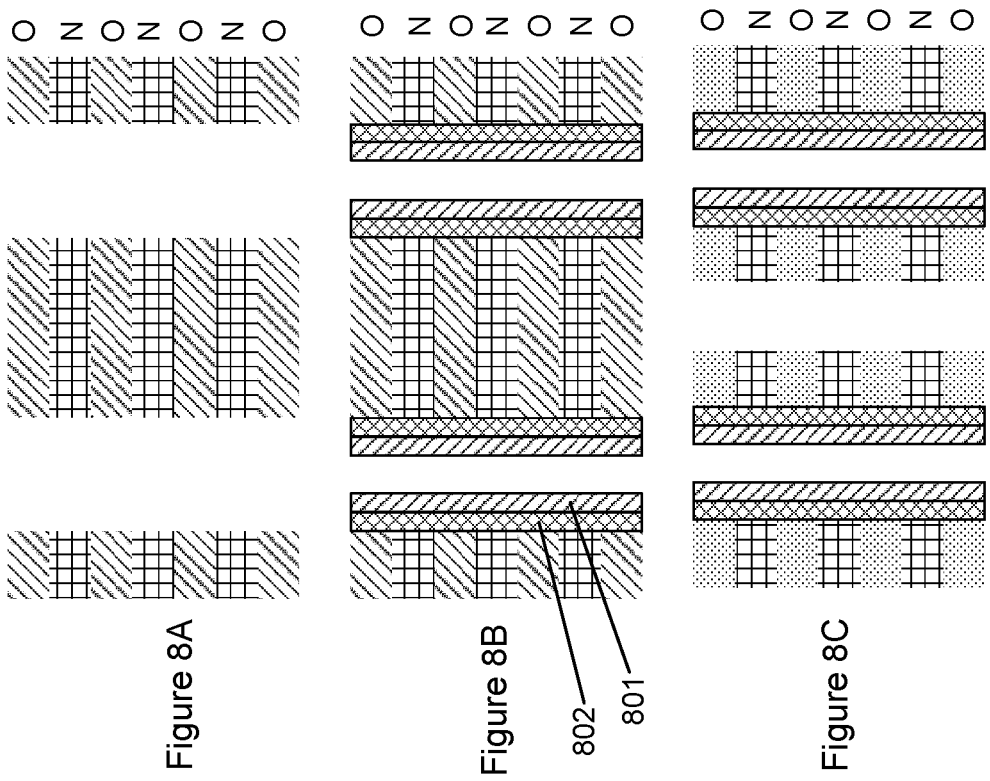
Figure 8A  Figure 8B  Figure 8C  Figure 8D  Figure 8E  Figure 8F

900

┌─────────────────────────────────────────────────────────┐
│ Provide a synapse including: (a) a semiconductor layer and a ferroelectric │
│ layer; (b) a first gate including first gate portions, a second gate including │
│ second gate portions, and a third gate including third gate portions; (c) │
│ wherein the semiconductor layer is between the first gate portions, the │
│ semiconductor layer is between the second gate portions, and the │
│ semiconductor layer is between the third gate portions. │
└─────────────────────────────────────────────────────────┘ 901

┌─────────────────────────────────────────────────────────┐
│ Provide an additional synapse including: (a) an additional │
│ semiconductor layer and an additional ferroelectric layer; (b) an additional │
│ first gate including additional first gate portions, an additional second gate │
│ including additional second gate portions, and an additional third gate │
│ including additional third gate portions; (c) wherein the additional │
│ semiconductor layer is between the additional first gate portions, the │
│ additional semiconductor layer is between the additional second gate │
│ portions, and the additional semiconductor layer is between the additional │
│ second gate portions. │
└─────────────────────────────────────────────────────────┘ 902

┌─────────────────────────────────────────────────────────┐
│ Supply an additional first signal to the additional first gate, an additional │
│ second signal to the additional second gate, and an additional third signal │
│ to the additional third gate and write an additional variable resistance to │
│ the additional semiconductor layer in response to supplying the additional │
│ first signal to the additional first gate, the additional second signal to the │
│ additional second gate, and the additional third signal to the additional │
│ third gate, wherein the additional variable resistance is an additional │
│ weight for the additional synapse. │
└─────────────────────────────────────────────────────────┘ 903

┌─────────────────────────────────────────────────────────┐
│ Supply an additional first signal to the additional first gate, an additional │
│ second signal to the additional second gate, and an additional third signal │
│ to the additional third gate and write an additional variable resistance to │
│ the additional semiconductor layer in response to supplying the additional │
│ first signal to the additional first gate, the additional second signal to the │
│ additional second gate, and the additional third signal to the additional │
│ third gate, wherein the additional variable resistance is an additional │
│ weight for the additional synapse. │
└─────────────────────────────────────────────────────────┘ 904

Figure 9A

FERROELECTRIC MEMORY-BASED SYNAPSES

TECHNICAL FIELD

Embodiments of the invention are in the field of artificial intelligence.

BACKGROUND

A neural network is a computing system that performs inferences and learns patterns in data by processing continuous signals with configurable circuit parameters and generally without task-specific programming. For example, a neural network may learn to identify a certain object from a picture/image. A neural network comprises a collection of processing units, called "neurons," that communicate with other neurons via connections, generally referred to as "synapses". A neural network generally has a few thousand to a few million units and millions of connections. Presently, most neural network algorithms are implemented in digital logic, which is inefficient and slow. Analog neuron circuits are inherently more efficient. However, forming a neural network using analog techniques and circuits requires numerous transistors to implement a neuron function. Conversely, spin/nanomagnet-based neurons implement a neural network with many fewer elements. However, existing spin/nanomagnet-based implementations are slow and require relatively high levels of power.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

FIGS. 8A-F depicts a process for synapse pillar formation in an embodiment.

FIGS. 9A and 9B depict a process for operation of a synapse pillar in an embodiment.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments (e.g., walls may not be exactly orthogonal to one another in actual fabricated devices). Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Phrases such as "comprising at least one of A and B" include situations with A, B, or A and B.

Figure 1:
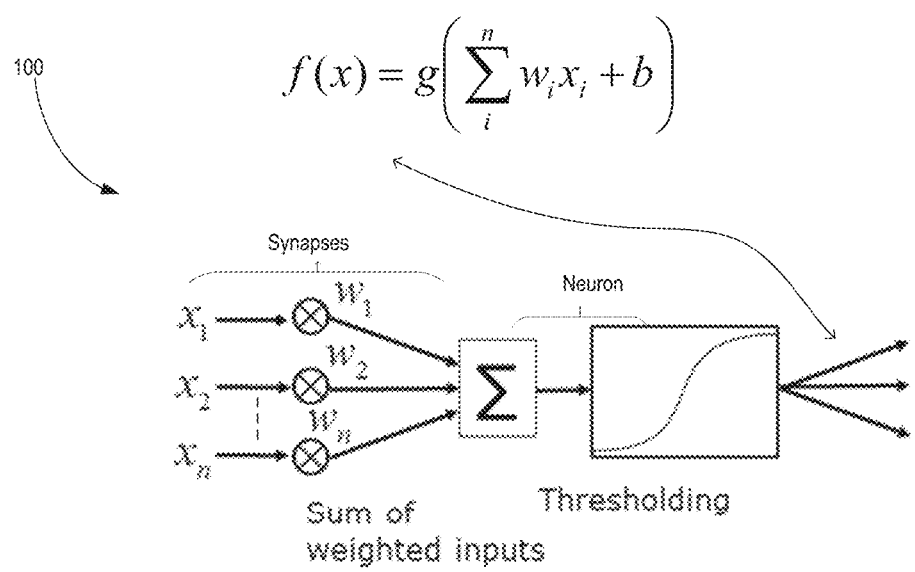
FIG. 1 illustrates a model of a neural gate comprising multiple input synapses and a neuron.
Figure 2:
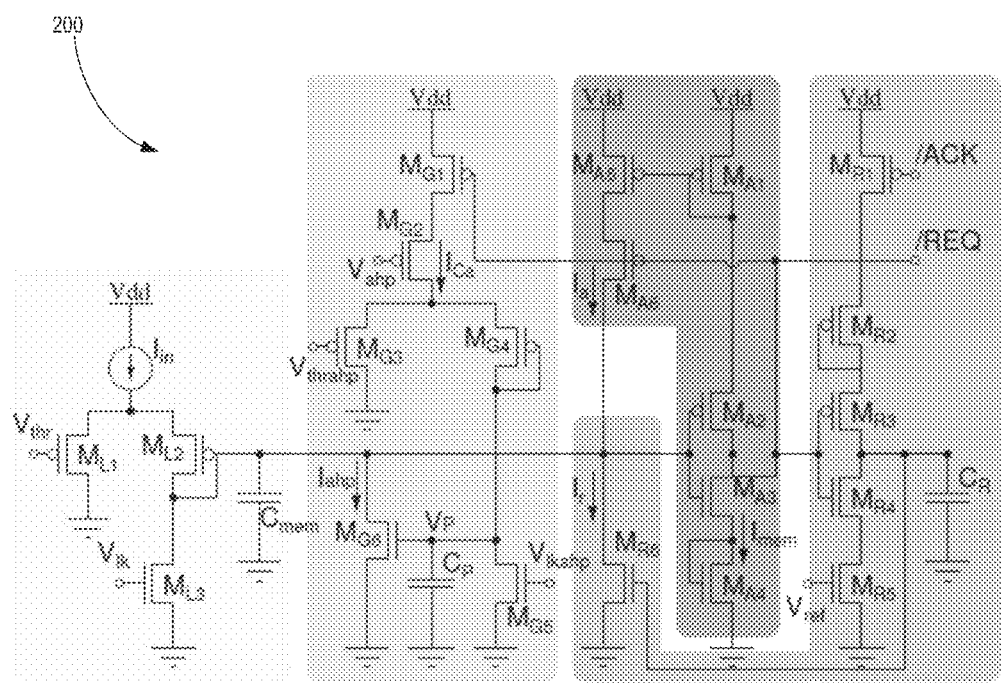
FIG. 2 illustrates a schematic of a neuron implemented with complementary metal oxide semiconductor (CMOS) transistors.
Figure 3:
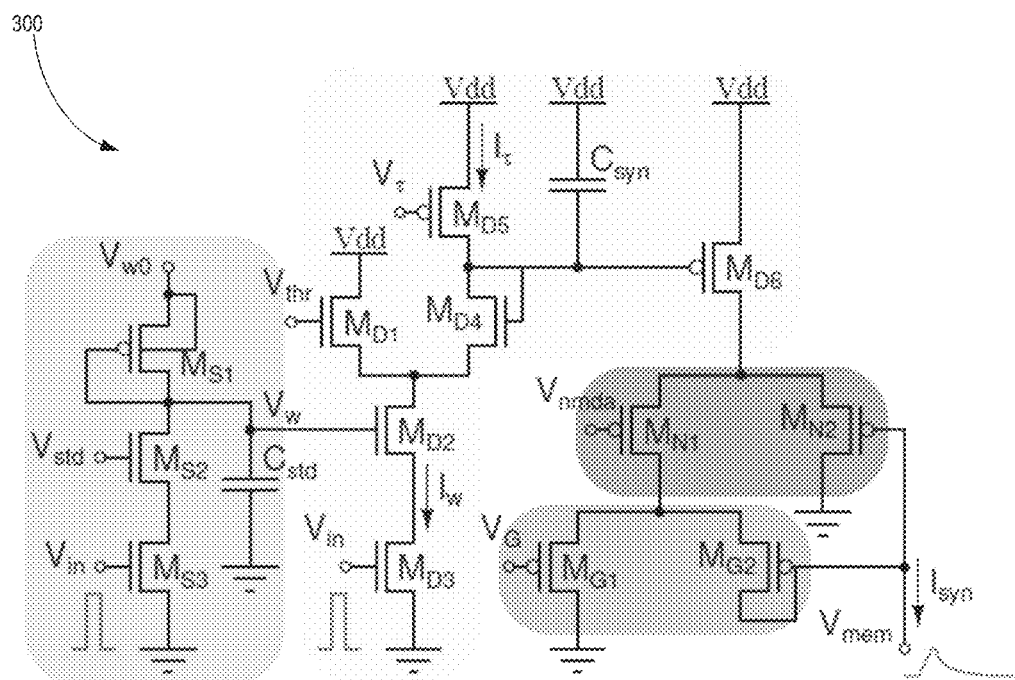
FIG. 3 illustrates a schematic of a synapse implemented with CMOS transistors.

FIG. 1 illustrates a model 100 of a neural gate comprising multiple input synapses and a neuron. A neural gate circuit is a building block of neural networks. It produces an output 'f' which is a non-linear function of an array of inputs x with n elements "$x_i$," and an array of stored weights "$w_i$", where 'i' is an integer index. Model 100 expresses a neural gate function: $F(x=g(\Sigma_i^n w_i x_i + b)$ where g(sum) is a step-like threshold function, also known as an activation function, and b is an offset that can be added to the sum. In some embodiments the thresholding function may be $g=\tan h(sum)$, or a step function $g=H(sum-\theta)$, or a sigmoid function $g=1/(1+\exp(-sum))$, or a rectified linear unit function $g=sum$ if $sum>0$ and $g=0$ if $sum<0$. Here, the synapses perform the product of input 'x' with its corresponding weights 'w'. These synapses are elements of the neural gate executing analog multiplication. The neuron is the element performing summation of the synapse inputs and applying the non-linear threshold function. FIGS. 2-3 illustrate complex CMOS implementations of neurons that use multiple transistors for a single synapse and single neuron.

FIG. 2 illustrates a schematic of a neuron 200 implemented with CMOS transistors. It comprises an input differential pair integrator (DPI) circuit used as a low-pass filter ($M_{L1-3}$), a spike-event generating amplifier with current-based positive feedback ($M_{A1-6}$), a spike reset circuit with refractory period functionality ($M_{R1-6}$) and a spike-frequency adaptation mechanism implemented by an additional DPI low-pass filter ($M_{G1-6}$).

The DPI block $M_{L1-3}$ models the neuron's leak conductance; it produces exponential sub-threshold dynamics in response to constant input currents. The neuron's membrane capacitance is represented by the capacitor $C_{mem}$ while sodium channel activation and inactivation dynamics are modeled by the positive-feedback circuits in the spike-generation amplifier $M_{A1-6}$. The spike-generation amplifier $M_{A1-6}$ implements current-based positive feedback (modeling both sodium activation and inactivation conductances) and produces address-events at extremely low-power operation.

The reset $M_{R1-6}$ block models the potassium conductance and refractory period functionality. The reset block ($M_{R1-6}$) resets the neuron and keeps it in a resting state for a refractory period, set by the $V_{ref}$ bias voltage. The spike-frequency adaptation block $M_{G1-6}$ models the neuron's Calcium conductance that produces the after-hyper-polarizing current $I_{ahp}$, which is proportional to the neuron's mean firing rate. The spike-frequency adaptation block is a low-pass filter ($M_{G1-6}$) which integrates the spikes and produces a slow after hyperpolarizing current $I_{ahp}$ responsible for spike-frequency adaptation.

FIG. 3 illustrates a schematic of a synapse 300 implemented with CMOS transistors. Synapse 300 is a DPI synapse circuit, including short term plasticity, N-Methyl-D-Aspartate (NMDA) voltage gating, and conductance-based functional blocks. The short-term depression block is implemented by MOSFETs $M_{S1-3}$; the basic DPI dynamics are implemented by the block $M_{D1-6}$; the NMDA voltage gated channels are implemented by $M_{N1-2}$, and conductance based voltage dependence is achieved with $M_{G1-2}$.

However, when neuron 200 and synapse 300 are used in a neural network that includes millions of neuron 200 and synapse 300, the area and power of the integrated circuit may become prohibitive. Even when digital circuitry is used for the synapse, such circuitry is problematic for accurately setting weights. Furthermore, circuitry such as memristors (resistive random access memory (RRAM)) requires undesirable amounts of time to supply numerous pulses to write weights to the synapses. Using analog circuitry creates difficulty in accurately setting weights for synapses.

In contrast, an embodiment provides a space, time, and power efficient architecture for a synapse and neuron. By using a plurality of digital variable resistance settings, a synapse weight is gained that approximates an analog weight (but without all of the power and space intensive analog circuitry). A layer of ferroelectric material is used to provide a memory element such that the programmed weights are non-volatile. As a result embodiments provide, in the least, the following advancements: (1) higher density of neural networks due to the use of 3D nanopillars, (2) faster operation of synapses because the entire synapse pillar may be written at one time taking only picoseconds in write-time duration, (3) well-defined channel resistances which lead to well-defined weights, and (4) weights are non-volatile due to the presence of ferroelectric memory cells in the nanopillar.

Figure 4:
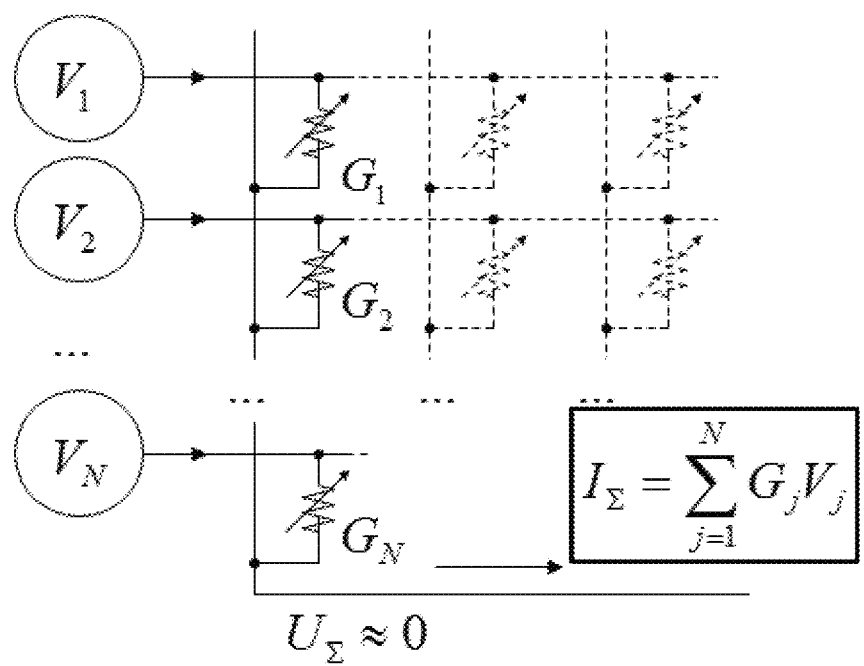
FIG. 4 includes a schematic of a neural network with variable resistor synapses.

FIG. 4 provides a circuit scheme of a neural network in an embodiment. The circuit includes variable resistors as weights, inputs as voltages, a summation of currents, and an amplifier for a nonlinear function. An embodiment uses a 3D nanopillar to implement each variable resistor of FIG. 4. The variable resistance is set by switching the ferroelectric polarization and thus affecting the charge density in a semiconductor channel.

Before addressing embodiments in greater detail, ferroelectric memory is discussed. Ferroelectric memory refers to a memory technology employing ferroelectric materials. A ferroelectric material is a material that exhibits, over some range of temperatures, a spontaneous electric polarization (i.e., displacement of positive and negative charges from their original position), that can be reversed or reoriented by application of an electric field. Because the displacement of the charges in ferroelectric materials can be maintained for some time even in the absence of an electric field, such materials may be used to implement memory cells. Ferroelectric materials may include anti-ferroelectric materials. Embodiments using ferroelectric memories provide adequate non-volatility, short programming time, low power consumption, high endurance, and high speed writing. In addition, such embodiments may be manufactured using processes compatible with the standard complementary metal-oxide-semiconductor (CMOS) technology. A ferroelectric memory cell disclosed herein includes a ferroelectric FET (field effect transistor)(FE-FET). The ferroelectric material employed in the FE-FET may include, for example, materials exhibiting ferroelectric behavior at thin dimensions, such as hafnium zirconium oxide (HfZrO, also referred to as HZO, which includes hafnium, zirconium, and oxygen), silicon-doped (Si-doped) hafnium oxide (which is a material that includes hafnium, oxygen, and silicon), germanium-doped (Ge-doped) hafnium oxide (which is a material that includes hafnium, oxygen, and germanium), aluminum-doped (Al-doped) hafnium oxide (which is a material that includes hafnium, oxygen, and aluminum), yttrium-doped (Y-doped) hafnium oxide (which is a material that includes hafnium, oxygen, and yttrium), lead zirconate titanate (which is a material that includes lead, zirconium, and titanium), PZT BFO (which is a material that includes lead, zirconium, titanium, oxygen, bismuth, and iron)(e.g., $Pb(Zr_{0.52}Ti_{0.48})O_3/BiFeO_3$) or combinations thereof. Some embodiments include hafnium, zirconium, barium, titanium, and/or lead, and combinations thereof.

Figure 5A:
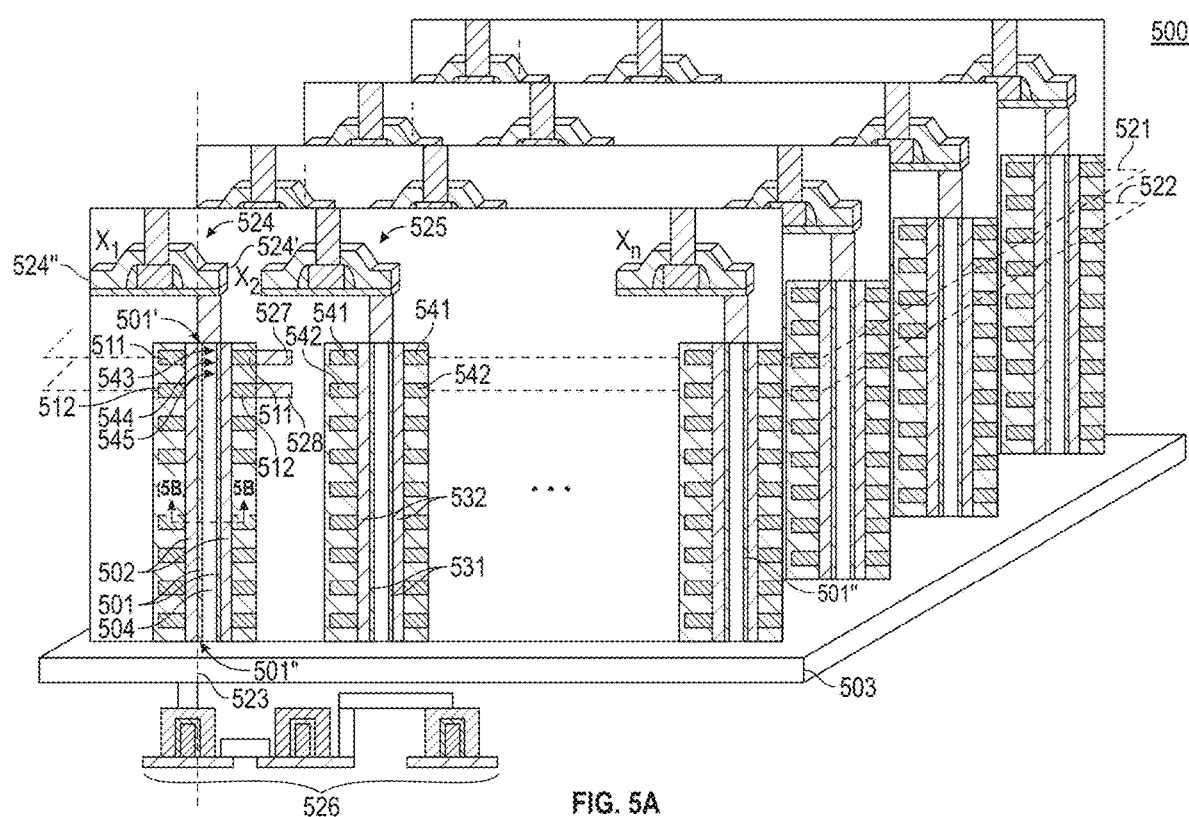
FIG. 5A depicts a cross-section of a neural network in an embodiment.

FIG. 5A provides an embodiment of a neural network 500. FIG. 5A includes nanopillars connected to a common plane for the summation of currents. Input voltages are applied to nodes (e.g., sources) of select transistors. The weights are written using inputs (e.g., bitlines) and select transistors. FIG. 5A is now addressed in greater detail.

Neural network 500 includes a first layer 501 and a second layer 502.

Layer 501 may include a semiconductor material, such as, for example, polysilicon, a III-V semiconductor, silicon, a IV semiconductor, or backend low-temperature transitory material such as IGZO. Layer 501 may be monolithic. By "monolithic", layer 501 is a continuous semiconductor layer that includes a portion that extends, uninterrupted, from, for example, semiconductor layer end portion 501' to semiconductor layer end portion 501".

Layer 502 may be monolithic in some embodiments and extend uninterrupted from the height of end 501' to end 501" (however in other embodiments layer 502 may include a non-continuous layer of ferroelectric material). Layer 502 may include oxygen and at least one of hafnium, silicon, yttrium, zirconium, barium, titanium, lead, or combinations thereof. Thus, layer 502 may include a ferroelectric material. Layer 502 may include, for example, hafnium zirconium oxide (HfZrO, also referred to as HZO, which includes hafnium, zirconium, and oxygen), silicon-doped (Si-doped) hafnium oxide (which is a material that includes hafnium, oxygen, and silicon), germanium-doped (Ge-doped) hafnium oxide (which is a material that includes hafnium, oxygen, and germanium), aluminum-doped (Al-doped) hafnium oxide (which is a material that includes hafnium, oxygen, and aluminum), yttrium-doped (Y-doped) hafnium oxide (which is a material that includes hafnium, oxygen, and yttrium), lead zirconate titanate (which is a material that includes lead, zirconium, and titanium), PZT BFO (which is a material that includes lead, zirconium, titanium, oxygen, bismuth, and iron)(e.g., $Pb(Zr_{0.52}Ti_{0.48})O_3/BiFeO_3$) or combinations thereof.

Network 500 may include a first gate including first gate portions 511 and a second gate including second gate portions 512. Layer 501 is between the first gate portions 511 and is also between the second gate portions 512. Layer 502 is between the first layer 501 and at least one of the first gate portions 511 and is also between the first layer 501 and at least one of the second gate portions 512. A first plane 521 intersects the first gate portions 511 and the first and second layers 501, 502, and a second plane 522 intersects the second gate portions 512 and the first and second layers 501, 502. First layer 501 includes a long axis 523 that is substantially orthogonal to the first and second planes 521, 522. Thus, the pillar that includes layers 501, 502 is "vertical" at least with respect to any substrate (not shown in the embodiment of FIGS. 5(A)-(B)) which may be disclosed in a plane parallel to plane 521. "Substantially orthogonal" may include a range +/−5 degrees (e.g., between 85 and 95 degrees with respect to plane 521).

Figure 5B:
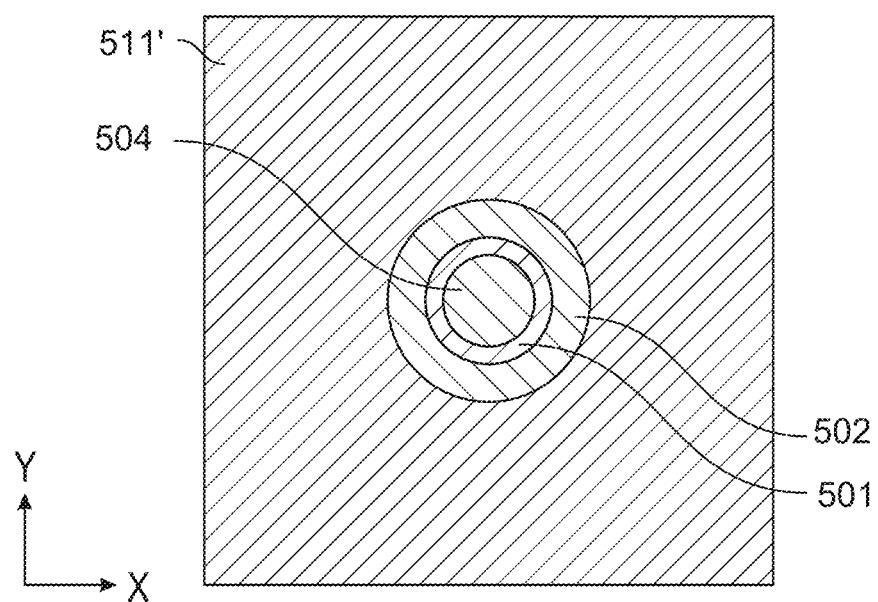
FIG. 5B depicts a cross-section of a portion of the network of FIG. 5A.

Circuit 500 includes first layer 531 and second layer 532. A first gate includes first gate portions 541 and a second gate including second gate portions 542. Layer 531 may be monolithic and layer 532 may be monolithic. First layer 531 is between the first gate portions 541 and is also between second gate portions 542. Layer 531 includes the same semiconductor material included in layer 501 in an embodiment but may be a different material in another embodiment. Second layer 532 is between layer 531 and at least one of gate portions 541 and is also between layer 531 and at least one of gate portions 542. Layer 532 may include the same material as layer 502 in an embodiment but may include another material in another embodiment. The first plane 521 intersects gate portions 541 and layers 531, 532. Plane 522 intersects the gate portions 542 and layers 531, 532. Layer 501 is not monolithic with layer 531. Core 504 may include a dielectric or may be filled with the semiconductor material of layer 531 or some other material in various embodiments. FIG. 5B depicts a cross-section (top view) including layers 501, 502, core 504, and a wrap-around gate contact 511'.

Network 500 includes a switching device 524 having a node 524' coupled to the first layer 501. Device 524 may have another node 524" to accept an input X1, similar to the input X1 of FIG. 1. Other access devices (e.g., thin film transistors having a source, channel, and drain) 525 work in a similar fashion to receive input X2 as shown in FIG. 1.

Network 500 includes layer 503 which includes a metal and is coupled to layers 501, 531. In other embodiments layer 503 may include other conductive materials that are not necessarily metals. This layer may be in the form of an interconnect line, a plate, or other conductive structure. Layer 503 may serve to sum outputs from layers 501, 531 in a manner similar to the summation block of FIG. 1

Figure 6:
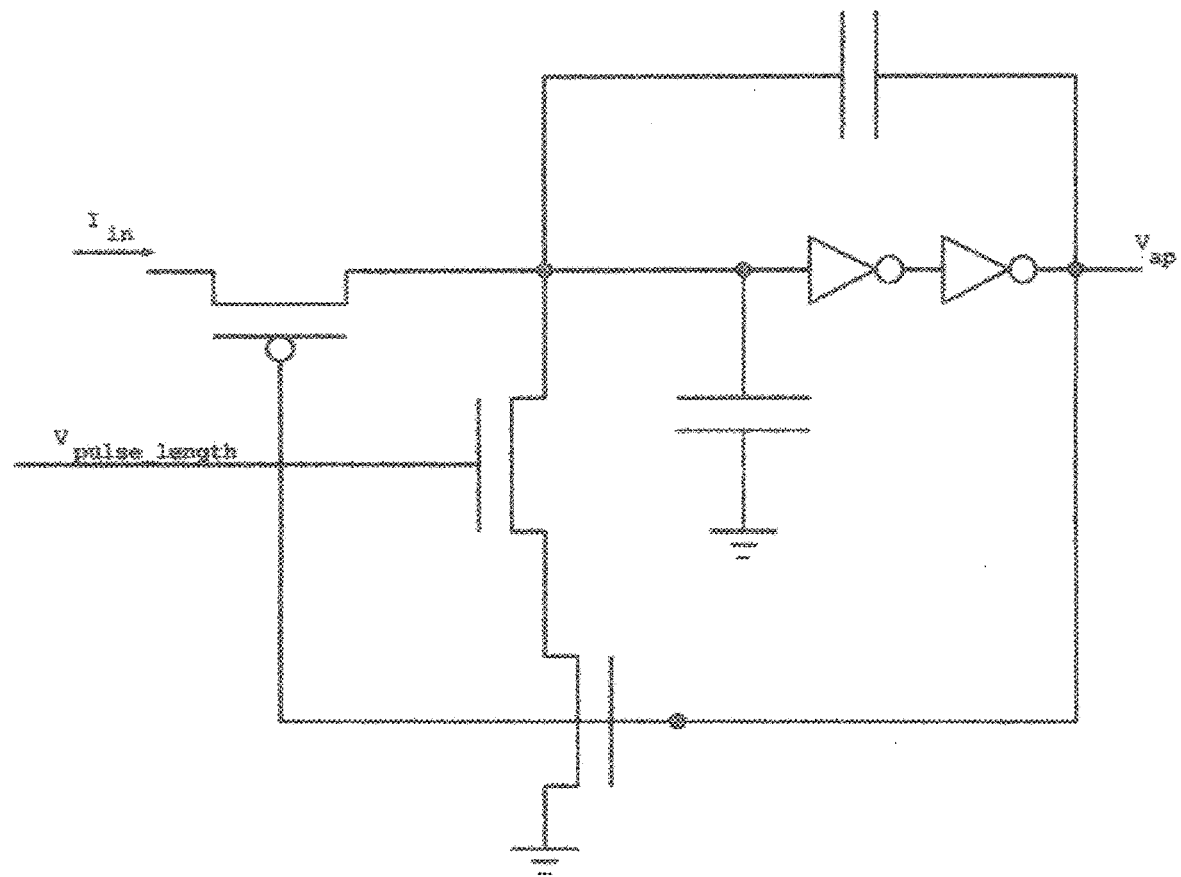
FIG. 6 depicts an embodiment of an analog circuit configured to apply a non-linear function to an output from a summation node in an embodiment.

Network 500 may include an amplifier that has a node coupled to layer 503. In an embodiment, network 500 includes an analog circuit 526. Circuit 526 includes a node coupled to layer 503 to receive a summed signal from layers 501, 531. Circuit 526 is configured to apply a non-linear thresholding/activation function, as specified above, to an output from layer 503. This is analogous to the thresholding function of the neuron in FIG. 1. FIG. 6 provides an example embodiment, an "integrate and fire neuron", for circuit 526 where the output is encoded as a rate of voltage pulses.

Thus, neural network 500 includes synapses and neurons similar to FIG. 1 but is implemented in a more efficient vertical fashion. Layer 501 is included in a synapse and layer 531 is included in an additional synapse. A weight of the synapse of layer 501 is based on a resistance of layer 501 and a weight (analogous to weights of FIG. 1) of the synapse of layer 531 is based on a resistance of layer 531. The resistance of layer 501 is a variable resistance configured to vary in magnitude of resistance in response to a signal 527 (which is to be applied to gate 511), and a signal 528 applied to the gate 512. The variable resistance is configured to include a number of resistance levels; and the number of resistance levels is proportional to a total number of gates corresponding to the first layer. For example, the pillar including layer 501 includes nine gates. Actual pillars may include many gates, such as 64 gates or more. The resistance of layer 501 may have a first setting when the gates have all been operated to provide uniform polarizations of layer 502. However, a second resistance setting may be obtained when 8 areas of layer 502 are polarized in one direction with a $9^{th}$ gate operating to make a $9^{th}$ area of layer 502 have an opposite polarization. Thus, 9 gates may accommodate at least 10 different resistance levels for layer 501. As the number of gates increases, the approximation of an analog resistance level also increases.

While layers 501, 531 may be included in synapses analogous to the synapses of FIG. 1, layer 503 and circuitry 526 are included in a neuron analogous to the neuron of FIG. 1.

Regarding the summation role of layer 503, in an embodiment there is no transistor between end 501" and the layer 503 as layer 503 sums the outputs of layers 501, 531 without prior modification of those outputs.

Further, the variable resistances of layers 501, 531 may be stored in non-volatile fashion. For example, gate 511 is included in a first memory cell that has no more than two possible memory states (e.g., 0 or 1) and gate 512 is included in a second memory cell that has no more than two possible memory states. For example, memory cell 529 may include gate 511 as well as source 543, channel 544, and drain 545 portions of layer 501. However, in other embodiments memory cells may have at least three possible memory states in a manner similar to memories that include floating gates (e.g., some forms of flash memory that store more than 1 bit per multi-level cell). In an embodiment the first and second gates 511, 512 are configured to simultaneously write a first memory state to the first memory cell (the cell including gate 511) and a second memory state to the second memory cell (the cell including gate 512).

An embodiment includes an array including rows of pillars such as the pillars that include layers 501, 531. The pillars that include layers 501, 531 are in a first row of pillars but other rows of pillars may be included in an embodiment. In such an embodiment gates in a level of one row (such as gates 511, 541) may operate simultaneously without operating a gate at the same level but in a different row. In an embodiment, gates 511, 512 may operate simultaneously so an entire "string" or layer 501 may be "written" with resistances (a weight of a synapse) at once. This provides a significant advantage over the time intensive application of pulses to memristor-based embodiments of synapses.

Figure 7:
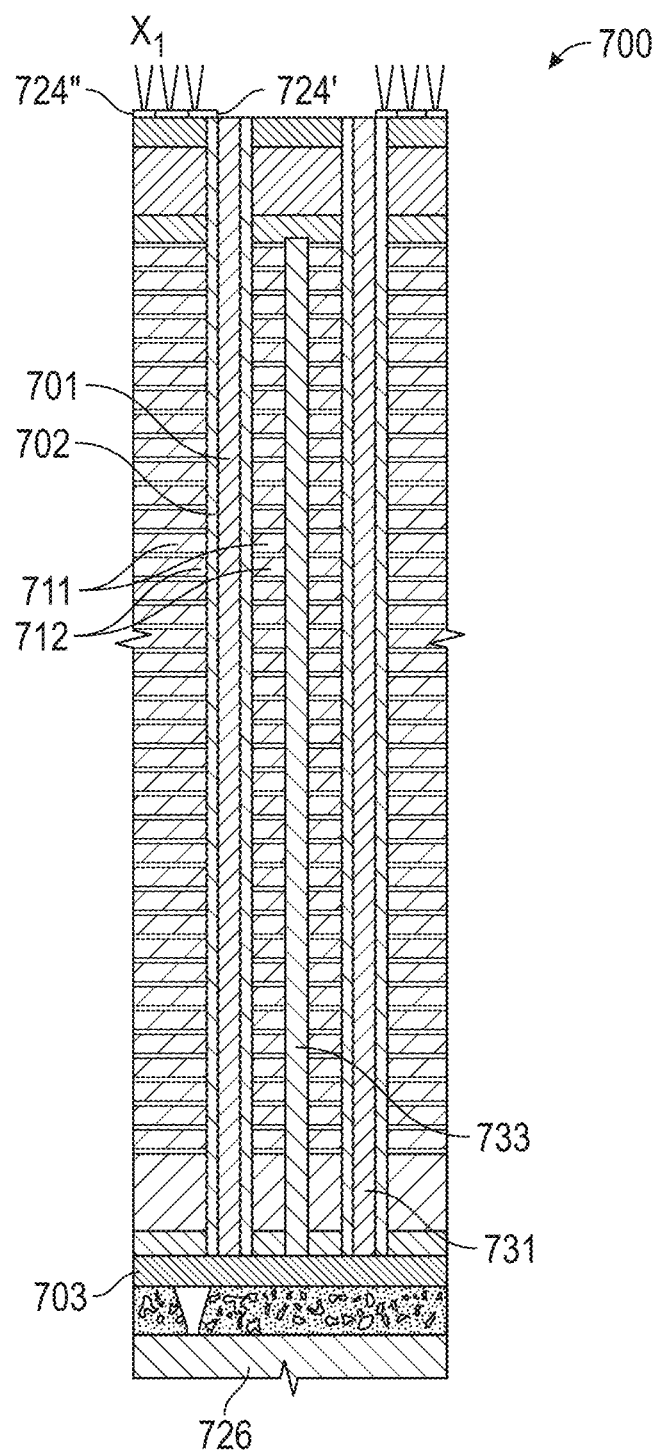
FIG. 7 is a depiction of an image of a cross-section of an embodiment.

FIG. 7 is a depiction of an image of a cross-section of an embodiment. Neural network 700 includes semiconductor layer 701 and ferroelectric layer 702. In this embodiment, the core and semiconductor layer are consolidated. Gates 711, 712 surround layers 701, 702. An access transistor (e.g., a thin film transistor in a backend of a system between metal layers) has a node 724" for input X1 and a node 724' to supply X1 to layer 701. Plate 703 sums outputs from various semiconductor layers 701, 731 and then transmits the summed signal to an analog circuit possibly located in a frontend (e.g., device layer) 726. Various pillars may be isolated from each other by trenches filled with dielectric 733.

FIGS. 8A-F includes a method for forming a neural circuit. In FIG. 8A oxide and nitride layers are formed (e.g., deposited) in alternating layers. Voids for pillars are formed (e.g., etched). FIG. 8B concerns cell stack formation where a ferroelectric layer 802 is formed and then a semiconductor layer 801 is formed. These layers may be formed using atomic layer deposition (ALD) or some other deposition technique. In FIG. 8C a void is formed (e.g., etch) that will eventually couple a summed value from the pillars to another portion of a neural network. In FIG. 8D the nitride layers are removed and then replaced with metal (e.g., tungsten) in FIG. 8E. The semiconductor layers 801, 831 are isolated from each other. In FIG. 8F a contact 899 is formed. The contact may take a signal from a circuit (such as circuit 526 of FIG. 5A) and communicate that signal to another synapse for another portion of a neural network.

Figure 10:
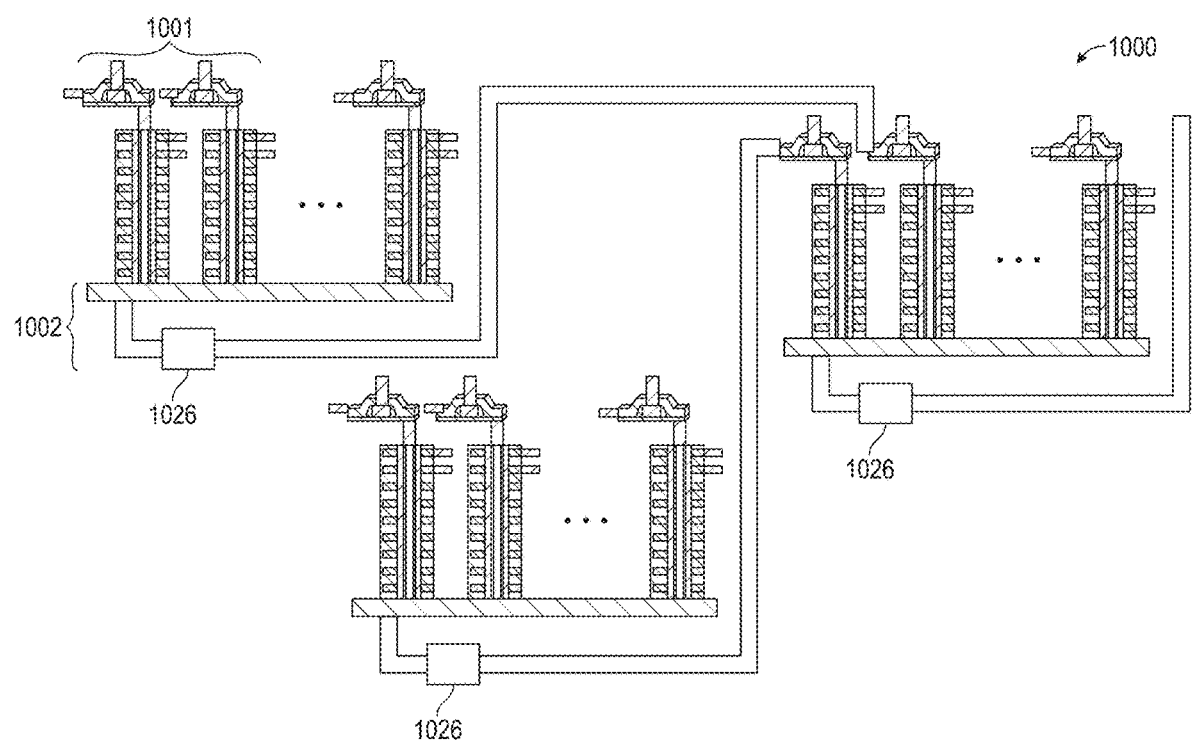
FIG. 10 depicts a neural network in an embodiment.

For example, FIG. 10 shows how various synapses 1001 may be coupled to a neuron 1002 (including an analog circuit 1026 analogous to circuit 526 of FIG. 5A), whose output is coupled to other stages of the neural circuit.

Figure 9B:
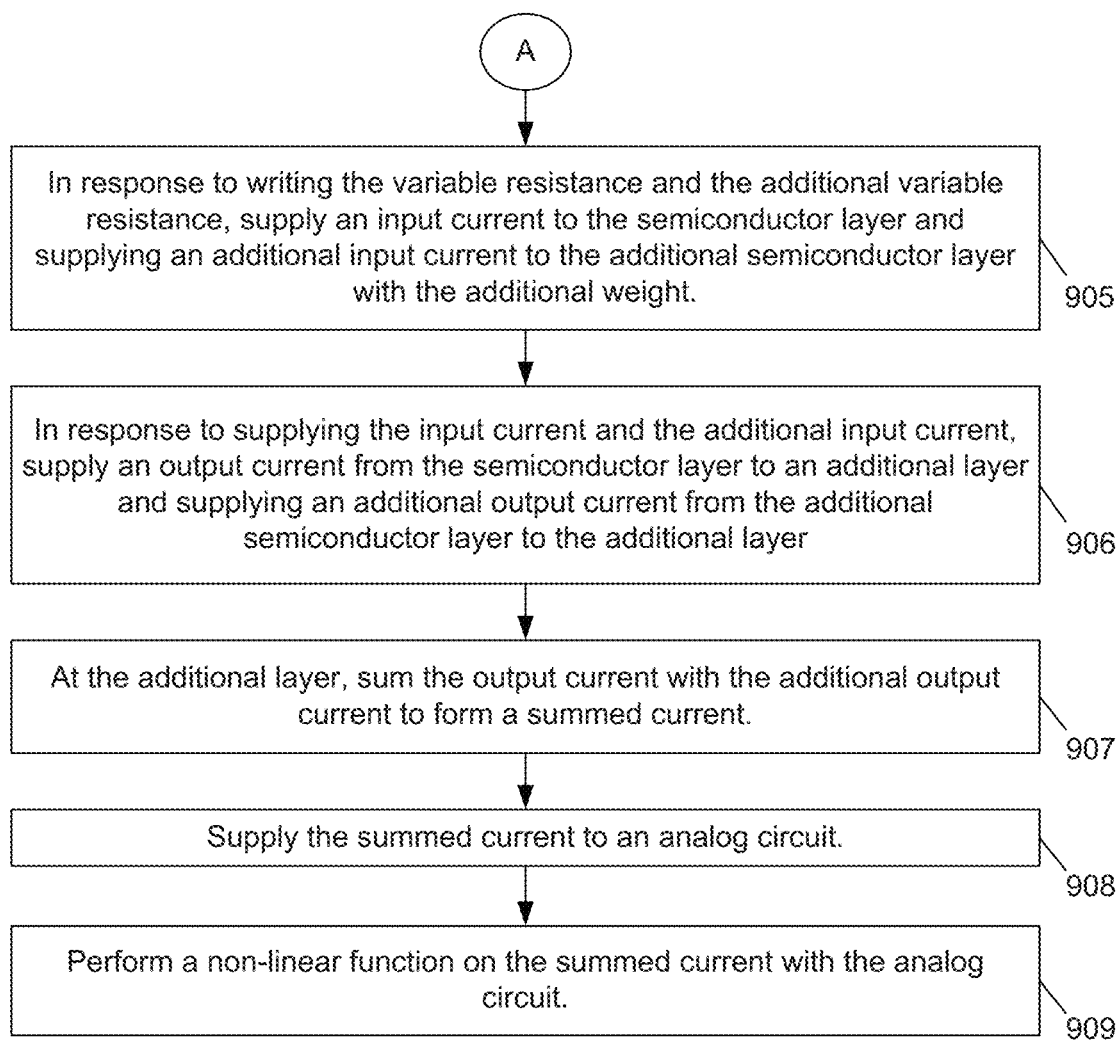

FIGS. 9A and 9B include a method 900 of operating a neural network.

Block 901 includes providing (a) a synapse including a semiconductor layer and a ferroelectric layer; (b) a first gate including first gate portions, a second gate including second gate portions, and a third gate including third date portions; (c) wherein the semiconductor layer is between the first gate portions, the semiconductor layer is between the second gate portions, and the semiconductor layer is between the third gate portions.

Block 902 includes providing (a) an additional synapse including an additional semiconductor layer and an additional ferroelectric layer; (b) an additional first gate including additional first gate portions, an additional second gate including additional second gate portions, and an additional third gate including additional third gate portions; (c) wherein the additional semiconductor layer is between the additional first gate portions, the additional semiconductor layer is between the additional second gate portions, and the additional semiconductor layer is between the additional second gate portions.

Block 903 includes supplying a first signal to the first gate, a second signal to the second gate, and a third signal to the third gate and write a variable resistance to the semiconductor layer in response to supplying the first signal to the first gate, the second signal to the second gate, and the third signal to the third gate, wherein the variable resistance is a weight for the synapse.

Block 904 includes supplying an additional first signal to the additional first gate, an additional second signal to the additional second gate, and an additional third signal to the additional third gate and write an additional variable resistance to the additional semiconductor layer in response to supplying the additional first signal to the additional first gate, the additional second signal to the additional second gate, and the additional third signal to the additional third gate, wherein the additional variable resistance is an additional weight for the additional synapse.

Block 905 includes, in response to writing the variable resistance and the additional variable resistance, supplying an input current to the semiconductor layer and supplying an additional input current to the additional semiconductor layer with the additional weight.

Block 906 includes, in response to supplying the input current and the additional input current, supplying an output current from the semiconductor layer to an additional layer and supplying an additional output current from the additional semiconductor layer to the additional layer.

Block 907 includes, at the additional layer, summing the output current with the additional output current to form a summed current. Block 908 includes supplying the summed current to an analog circuit. Block 909 includes performing a non-linear function on the summed current with the analog circuit.

Figure 11:
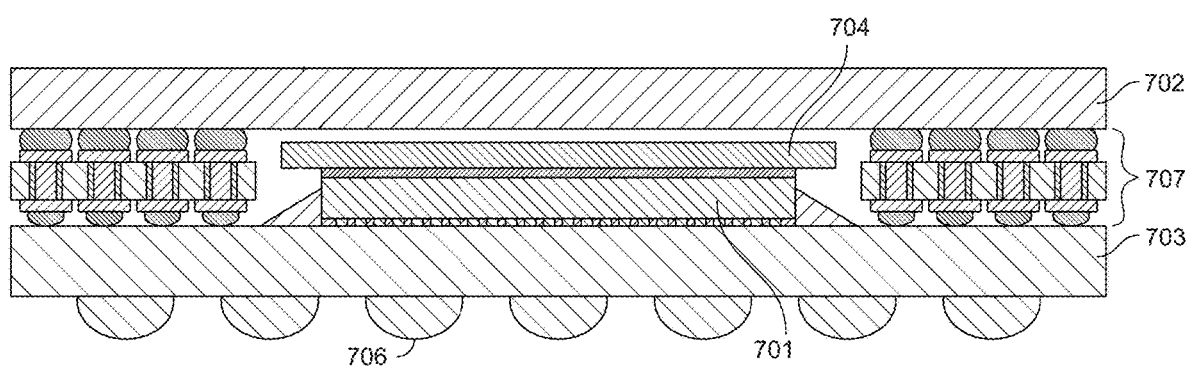
FIGS. 11, 12, 13, 14 include systems that include embodiments.

FIG. 11 includes a package system in an embodiment. The system includes a processor die 701 (a first package) on a package substrate 703. A memory die (a second package) 702 couples to the substrate 703 by way of interposer system 707. Underfill material exists between die 701 and substrate 703. Substrate 703 may include controlled collapse chip connection (C4) interconnects 706. Further, to prevent warping of die 701, die 701 may couple to a metal stiffener 704. Die 701 may include a die stack (e.g., multiple dies which may have the same function or differing functions) that may be molded as one unit that functions as a single die. For example, one die of the stack may have a first logic function while another die of the stack has another logic function that differs from the first logic function.

In the embodiment of FIG. 11, die 701 may include the neural networks described herein. Arrays such as the array of FIG. 5A may be stacked on top of each other such that not only are the pillars arranged vertically, but there are multiple levels of pillars stacked vertically. In an embodiment element 704 is not a stiffener but instead is a heat spreader (or is both a stiffener and a heat spreader).

Thus, FIG. 11 depicts an integrated circuit, a memory, and a package housing that includes the integrated circuit and the memory. The integrated circuit includes neural networks described herein. For example, the circuit may be a field programmable gate array (FPGA) that implements neural networks described herein.

Figure 12:
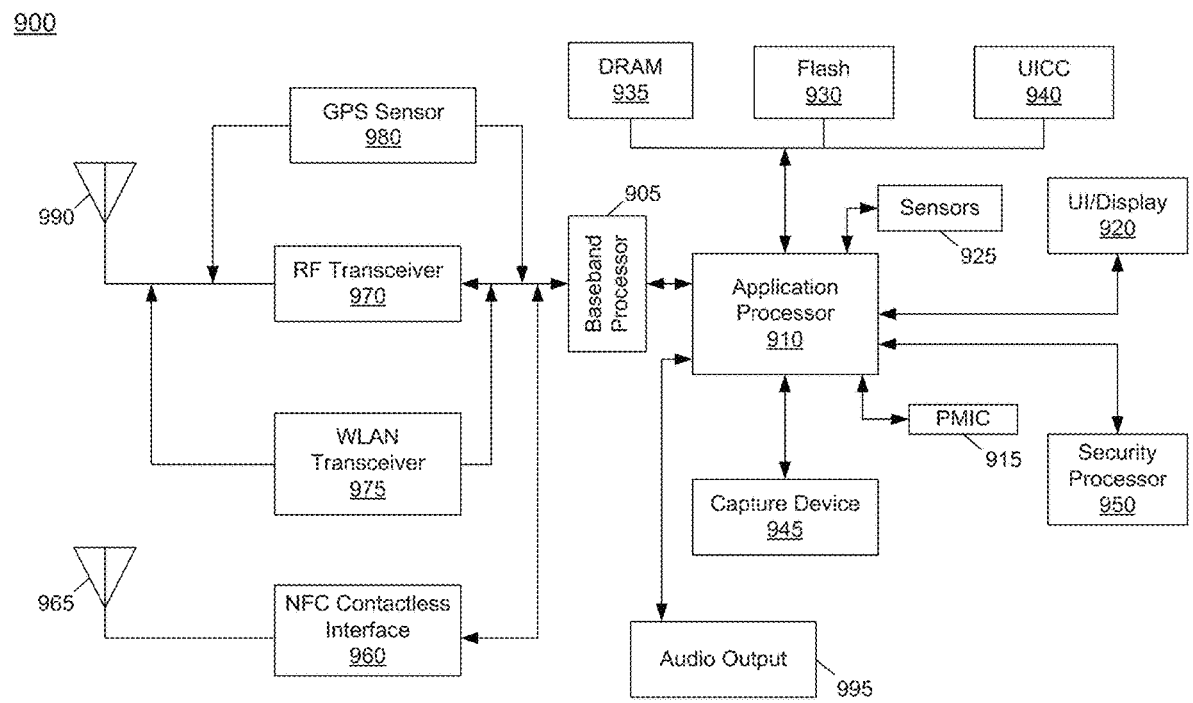

Referring now to FIG. 12, shown is a block diagram of an example system with which embodiments can be used. As seen, system 900 may be a smartphone or other wireless communicator or any other Internet of Things (IoT) device. A baseband processor 905 is configured to perform various signal processing with regard to communication signals to be transmitted from or received by the system. In turn, baseband processor 905 is coupled to an application processor 910, which may be a main CPU (which may include neural networks described herein) of the system to execute an OS and other system software, in addition to user applications such as many well-known social media and multimedia apps. Application processor 910 may further be configured to perform a variety of other computing operations (e.g., neural processing) for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. As further seen, application processor 910 also couples to audio output 995 and a capture device 945 such as one or more image capture devices that can record video and/or still images.

A universal integrated circuit card (UICC) 940 comprises a subscriber identity module, which in some embodiments includes a secure storage to store secure user information. System 900 may further include a security processor 950 (e.g., Trusted Platform Module (TPM)) that may couple to application processor 910. A plurality of sensors 925, including one or more multi-axis accelerometers may couple to application processor 910 to enable input of a variety of sensed information such as motion and other environmental information. In addition, one or more authentication devices may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more internet of things (IoT) networks, various circuitry may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 4G or 5G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 13:
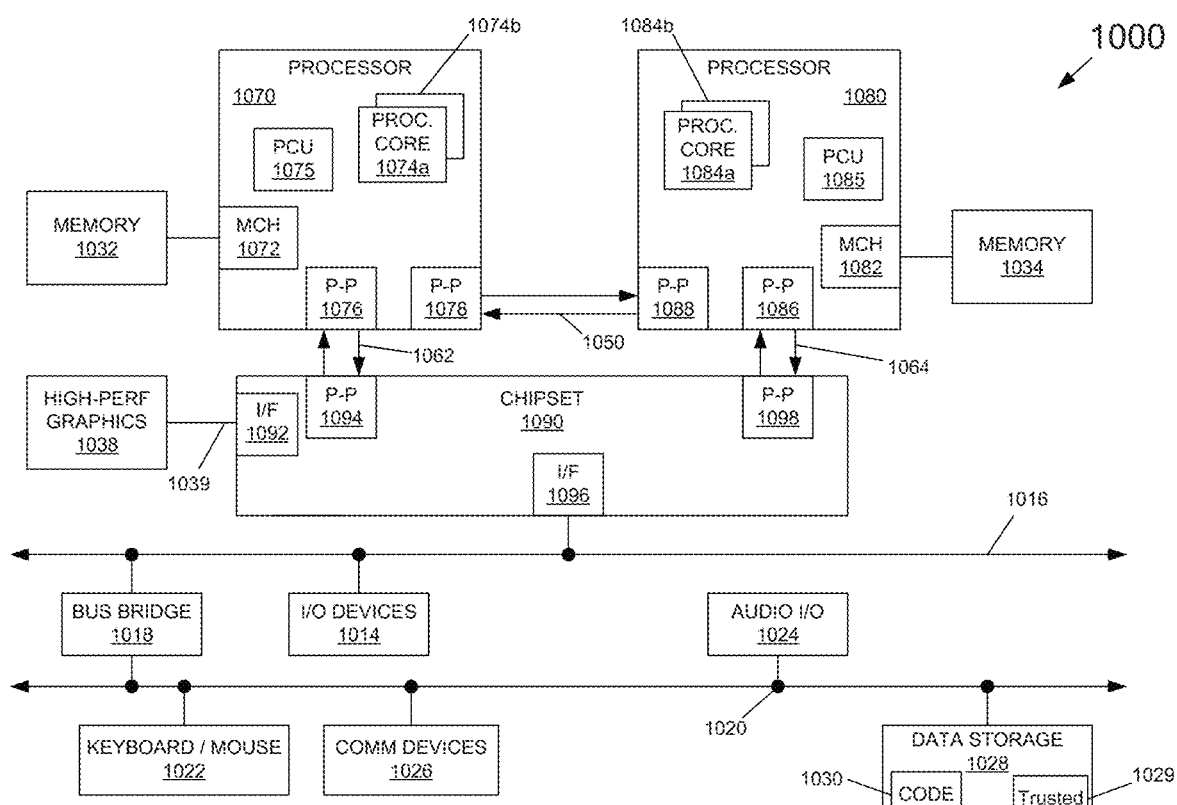

Referring now to FIG. 13, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 (which may include neural networks described herein) via P-P interconnects 1062 and 1064, respectively. Chipset 1090 includes P-P interfaces 1094 and 1098.

Furthermore, chipset 1090 includes an interface 1092 to couple chipset 1090 with a high performance graphics engine 1038 (which may include neural networks described herein), by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Figure 14:
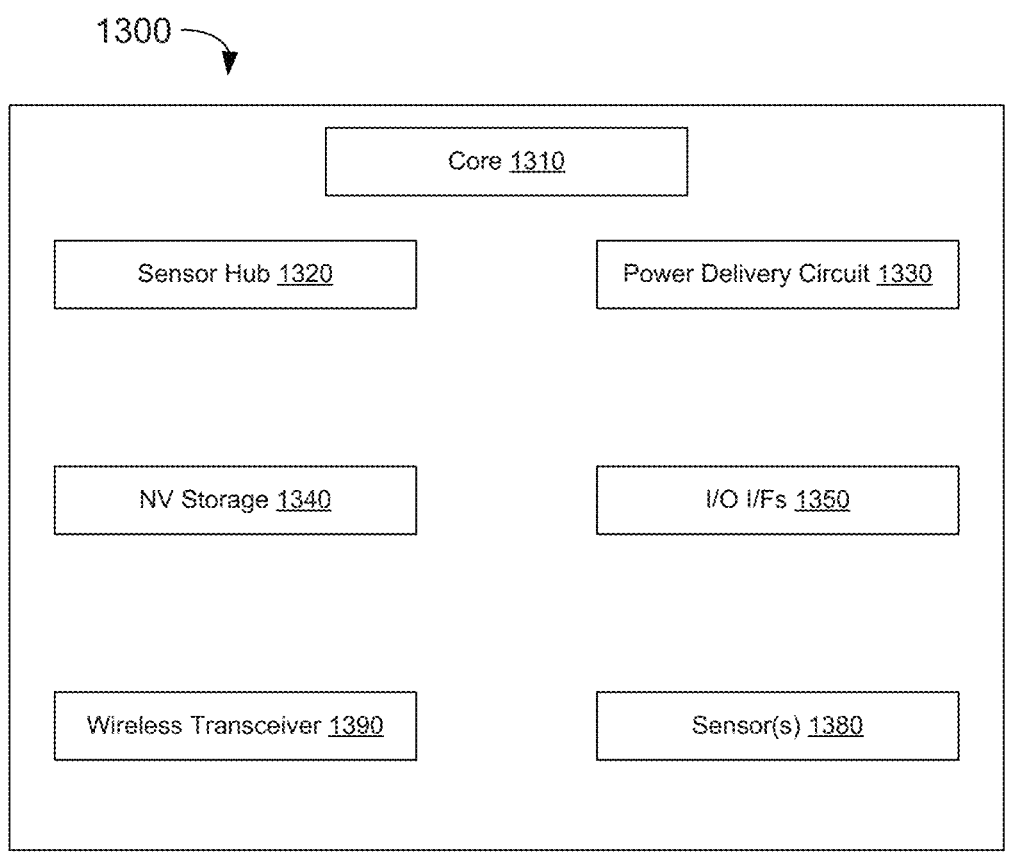

Referring now to FIG. 14, embodiments may be used in environments where IoT devices may include wearable devices or other small form factor IoT devices. Shown is a block diagram of a wearable module 1300 in accordance with another embodiment. In one particular implementation, module 1300 may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. The core may include neural networks described herein. In some embodiments, core 1310 may implement a Trusted Execution Environment (TEE). Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340. In an embodiment, this circuit may include a rechargeable battery and a recharging circuit, which may in one embodiment receive charging power wirelessly. One or more input/output (IO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

The following examples pertain to further embodiments.

Example 1

An apparatus comprising: a first layer and a second layer; a first gate including first gate portions and a second gate including second gate portions; wherein the first layer: (a) is monolithic, (b) is between the first gate portions and is also between the second gate portions, and (c) includes a semiconductor material; wherein the second layer: (a) is between the first layer and at least one of the first gate portions and is also between the first layer and at least one of the second gate portions, and (b) includes oxygen and at least one of hafnium, silicon, yttrium, zirconium, barium, titanium, lead, or combinations thereof; wherein (a) a first plane intersects the first gate portions and the first and second layers, and (b) a second plane intersects the second gate portions and the first and second layers.

Example 2

The apparatus of claim 1 comprising: an additional first layer and an additional second layer; an additional first gate including additional first gate portions and an additional second gate including additional second gate portions; wherein the additional first layer: (a) is monolithic, (b) is between the additional first gate portions and is also between the additional second gate portions, and (c) includes the semiconductor material; wherein the additional second layer: (a) is between the additional first layer and at least one of the additional first gate portions and is also between the additional first layer and at least one of the additional second gate portions, and (b) includes oxygen and the at least one of hafnium, silicon, yttrium, zirconium, barium, titanium, lead, or combinations thereof; wherein (a) the first plane intersects the additional first gate portions and the additional first and additional second layers, and (b) the second plane intersects the additional second gate portions and the additional first and additional second layers; wherein the first layer is not monolithic with the additional first layer.

Example 3

The apparatus of example 2 comprising a third layer, wherein the third layer: (a) includes a metal; and (b) is coupled to the first layer and the additional first layer.

Example 4

The apparatus of example 3 comprising a switching device having a node coupled to the first layer.

Example 5

The apparatus of example 4 comprising an amplifier, the amplifier including a node coupled to the third layer.

Example 6

The apparatus of example 4 comprising an analog circuit, wherein the analog circuit: includes a node coupled to the third layer; and is configured to apply a non-linear function to an output from the third layer.

Example 7

The apparatus of example 5 wherein the first layer is included in a synapse and the additional first layer is included in an additional synapse.

Example 8

The apparatus of example 7 wherein a weight of the synapse is based on a resistance of the first layer and an additional weight of the additional synapse is based on an additional resistance of the additional first layer.

Example 9

The apparatus of example 8 comprising a neuron corresponding to the synapse, the neuron including the amplifier.

Example 10

The apparatus of example 9 wherein the neuron includes the third layer.

Example 11

The apparatus of example 8 wherein the resistance is a variable resistance configured to vary in magnitude of resistance in response to: (a) a first signal to be applied to the first gate, and (b) a second signal to be applied to the second gate.

Example 12

The apparatus of example 11 wherein: the variable resistance is configured to include a number of resistance levels; and the number of resistance levels is proportional to a total number of gates corresponding to the first layer.

Example 13

The apparatus of example 4 wherein: the first layer includes a first end opposing a second end; the first end is coupled between the switching device and the second end; no transistor is coupled between the second end and the third layer.

Example 14

The apparatus of example 3 wherein the third layer is configured to combine output current from the first layer with additional output current from the additional first layer.

Example 15

The apparatus of example 2 comprising: a supplemental first layer and a supplemental second layer; a supplemental first gate including supplemental first gate portions and a supplemental second gate including supplemental second gate portions; wherein the supplemental first layer: (a) is monolithic, (b) is between the supplemental first gate portions and is also between the supplemental second gate portions, and (c) includes the semiconductor material; wherein the supplemental second layer: (a) is between the supplemental first layer and at least one of the supplemental first gate portions and is also between the supplemental first layer and at least one of the supplemental second gate portions, and (b) includes oxygen and the at least one of hafnium, silicon, yttrium, zirconium, barium, titanium, lead, or combinations thereof; wherein (a) the first plane intersects the supplemental first gate portions and the supplemental first and supplemental second layers, and (b) the second plane intersects the supplemental second gate portions and the supplemental first and supplemental second layers; wherein the first layer is not monolithic with the supplemental first layer; wherein (d)(i) the first gate and the additional first gate are configured to operate simultaneously, and (d)(ii) the first gate and the supplemental first gate are configured to operate non-simultaneously.

Example 16

The apparatus of example 1, wherein (a) the first gate is included in a first memory cell that has no more than two possible memory states, and (a) the second gate is included in a second memory cell that has no more than two possible memory states.

Example 17

The apparatus of example 1, wherein (a) the first gate is included in a first memory cell that has at least three possible memory states, and (a) the second gate is included in a second memory cell that has at least three possible memory states.

Example 18

The apparatus of example 1 wherein the second layer is monolithic.

Example 19

The apparatus of example 1 wherein: the first gate is included in a first memory cell and the second gate is included in a second memory cell; the first and second gates are configured to simultaneously write a first memory state to the first memory cell and a second memory state to the second memory cell.

Example 20

The system of example 1 comprising: an integrated circuit on a first die, the integrated circuit including the first layer; a memory on a second die; the first die and the second die both on a package substrate.

Example 21

The system of example 19 wherein the integrated circuit comprises a field programmable gate array (FPGA).

Example 22

The system of example 1 wherein the first layer includes a long axis that is substantially orthogonal to the first and second planes.

Example 23

A method comprising: providing a synapse including: (a) a semiconductor layer and a ferroelectric layer, the semiconductor layer being monolithic; (b) a first gate including first gate portions, a second gate including second gate portions, and a third gate including third gate portions; (c) wherein the semiconductor layer is between the first gate portions, the semiconductor layer is between the second gate portions, and the semiconductor layer is between the third gate portions; providing an additional synapse including: (a) an additional semiconductor layer and an additional ferroelectric layer, the additional semiconductor layer being monolithic; (b) an additional first gate including additional first gate portions, an additional second gate including additional second gate portions, and an additional third gate including additional third gate portions; (c) wherein the additional semiconductor layer is between the additional first gate portions, the additional semiconductor layer is between the additional second gate portions, and the additional semiconductor layer is between the additional second gate portions; supplying a first signal to the first gate, a second signal to the second gate, and a third signal to the third gate; writing a variable resistance to the semiconductor layer in response to supplying the first signal to the first gate, the second signal to the second gate, and the third signal to the third gate, wherein the variable resistance is a weight for the synapse; supplying an additional first signal to the additional first gate, an additional second signal to the additional second gate, and an additional third signal to the additional third gate; writing an additional variable resistance to the additional semiconductor layer in response to supplying the additional first signal to the additional first gate, the additional second signal to the additional second gate, and the additional third signal to the additional third gate, wherein the additional variable resistance is an additional weight for the additional synapse; in response to writing the variable resistance and the additional variable resistance, supplying an input current to the semiconductor layer and supplying an additional input current to the additional semiconductor layer with the additional weight; in response to supplying the input current and the additional input current, supplying an output current from the semiconductor layer to an additional layer and supplying an additional output current from the additional semiconductor layer to the additional layer; at the additional layer, summing the output current with the additional output current to form a summed current; supplying the summed current to an analog circuit; and performing a non-linear function on the summed current with the analog circuit.

Example 24

The method of example 23 supplying a supplemental first signal to the first gate, a supplemental second signal to the second gate, and a supplemental third signal to the third gate; writing a supplemental variable resistance to the semiconductor layer in response to supplying the supplemental first signal to the first gate, the supplemental second signal to the second gate, and the supplemental third signal to the third gate, wherein the supplemental variable resistance is a supplemental weight for the synapse; wherein the weight is unequal to the supplemental weight; wherein the weight is unequal to zero and the supplemental weight is unequal to zero.

Example 25

An apparatus comprising: a substrate including a surface defined by a plane; a synapse including (a)(i) a pillar having a semiconductor layer and a ferroelectric layer; (a)(ii) first and second memory cells positioned along the pillar; wherein (b)(i) the pillar is substantially orthogonal to the plane, and (b)(ii) the first memory cell includes a first gate and first portions of the semiconductor and ferroelectric layers and the second memory cell includes a second gate and second portions of the semiconductor and ferroelectric layers; an additional synapse including (a)(i) an additional pillar having an additional semiconductor layer and an additional ferroelectric layer; (a)(ii) additional first and second memory cells positioned along the additional pillar; wherein (b)(i) the additional pillar is substantially orthogonal to the plane, and (b)(ii) the additional first memory cell includes an additional first gate and additional first portions of the additional semiconductor and additional ferroelectric layers and the additional second memory cell includes an additional second gate and additional second portions of the additional semiconductor and additional ferroelectric layers; wherein the semiconductor layer is to have a resistance based on memory states of the first and second memory cells and the additional semiconductor layer is to have an additional resistance based on additional memory states of the additional first and second memory cells.

Example 26

The apparatus of example 25 comprising a layer to sum an output current from the semiconductor layer with an additional output current from the additional semiconductor layer.

Example 1a: An apparatus comprising: a first layer and a second layer; a first gate including first gate portions and a second gate including second gate portions; wherein the first layer: (a) is monolithic, (b) is between the first gate portions and is also between the second gate portions, and (c) includes a semiconductor material; wherein the second layer: (a) is between the first layer and at least one of the first gate portions and is also between the first layer and at least one of the second gate portions, and (b) includes oxygen and at least one of hafnium, silicon, yttrium, zirconium, barium, titanium, lead, or combinations thereof; wherein (a) a first plane intersects the first gate portions and the first and second layers, and (b) a second plane intersects the second gate portions and the first and second layers.

Example 2a

The apparatus of example 1a comprising: an additional first layer and an additional second layer; an additional first gate including additional first gate portions and an additional second gate including additional second gate portions; wherein the additional first layer: (a) is monolithic, (b) is between the additional first gate portions and is also between the additional second gate portions, and (c) includes the semiconductor material; wherein the additional second layer: (a) is between the additional first layer and at least one of the additional first gate portions and is also between the additional first layer and at least one of the additional second gate portions, and (b) includes oxygen and the at least one of hafnium, silicon, yttrium, zirconium, barium, titanium, lead, or combinations thereof; wherein (a) the first plane intersects the additional first gate portions and the additional first and additional second layers, and (b) the second plane intersects the additional second gate portions and the additional first and additional second layers; wherein the first layer is not monolithic with the additional first layer.

Example 3a

The apparatus of example 2a comprising a third layer, wherein the third layer: (a) includes a metal; and (b) is coupled to the first layer and the additional first layer.

Example 4a

The apparatus according to any of examples 1a-3a comprising a switching device having a node coupled to the first layer.

Example 5a

The apparatus according to any of examples 3a-4a comprising an amplifier, the amplifier including a node coupled to the third layer.

Example 6a

The apparatus according to any of examples 3a-4a comprising an analog circuit, wherein the analog circuit: includes a node coupled to the third layer; and is configured to apply a non-linear function to an output from the third layer.

Example 7a

The apparatus according to any of examples 2a-6a wherein the first layer is included in a synapse and the additional first layer is included in an additional synapse.

Example 8a

The apparatus of example 7a wherein a weight of the synapse is based on a resistance of the first layer and an additional weight of the additional synapse is based on an additional resistance of the additional first layer.

Example 9a

The apparatus according to any of examples 7a-8a comprising a neuron corresponding to the synapse, the neuron including the amplifier.

Example 10a

The apparatus of example 9a wherein the neuron includes the third layer.

Example 11a

The apparatus according to any of examples 8a-10a wherein the resistance is a variable resistance configured to vary in magnitude of resistance in response to: (a) a first signal to be applied to the first gate, and (b) a second signal to be applied to the second gate.

Example 12a

The apparatus of example 11a wherein: the variable resistance is configured to include a number of resistance levels; and the number of resistance levels is proportional to a total number of gates corresponding to the first layer.

Example 13a

The apparatus according to any of examples 4a-12a wherein: the first layer includes a first end opposing a second end; the first end is coupled between the switching device and the second end; no transistor is coupled between the second end and the third layer.

Example 14a

The apparatus according to any of examples 3a-13a wherein the third layer is configured to combine output current from the first layer with additional output current from the additional first layer.

Example 15a

The apparatus according to any of examples 2a-14a comprising: a supplemental first layer and a supplemental second layer; a supplemental first gate including supplemental first gate portions and a supplemental second gate including supplemental second gate portions; wherein the supplemental first layer: (a) is monolithic, (b) is between the supplemental first gate portions and is also between the supplemental second gate portions, and (c) includes the semiconductor material; wherein the supplemental second layer: (a) is between the supplemental first layer and at least one of the supplemental first gate portions and is also between the supplemental first layer and at least one of the supplemental second gate portions, and (b) includes oxygen and the at least one of hafnium, silicon, yttrium, zirconium, barium, titanium, lead, or combinations thereof; wherein (a) the first plane intersects the supplemental first gate portions and the supplemental first and supplemental second layers, and (b) the second plane intersects the supplemental second gate portions and the supplemental first and supplemental second layers; wherein the first layer is not monolithic with the supplemental first layer; wherein (d)(i) the first gate and the additional first gate are configured to operate simultaneously, and (d)(ii) the first gate and the supplemental first gate are configured to operate non-simultaneously.

Example 16a

The apparatus according to any of examples 1a-15a, wherein (a) the first gate is included in a first memory cell that has no more than two possible memory states, and (a) the second gate is included in a second memory cell that has no more than two possible memory states.

Example 17a

The apparatus according to any of examples 1a-15a, wherein (a) the first gate is included in a first memory cell that has at least three possible memory states, and (a) the second gate is included in a second memory cell that has at least three possible memory states.

Example 18a

The apparatus according to any of examples 1a-17a wherein the second layer is monolithic.

Example 19a

The apparatus according to any of examples 1a-18a wherein: the first gate is included in a first memory cell and the second gate is included in a second memory cell; the first and second gates are configured to simultaneously write a first memory state to the first memory cell and a second memory state to the second memory cell.

Example 20a

The system according to any of examples 1a-19a comprising: an integrated circuit on a first die, the integrated circuit including the first layer; a memory on a second die; the first die and the second die both on a package substrate.

Example 21a

The system of example 19a wherein the integrated circuit comprises a field programmable gate array (FPGA).

Example 22a

The system according to any of examples 1a-21a wherein the first layer includes a long axis that is substantially orthogonal to the first and second planes.

Example 23a

A method comprising: providing (a) a synapse including a semiconductor layer and a ferroelectric layer, the semiconductor layer being monolithic; (b) a first gate including first gate portions, a second gate including second gate portions, and a third gate including third date portions; (c) wherein the semiconductor layer is between the first gate portions, the semiconductor layer is between the second gate portions, and the semiconductor layer is between the third gate portions; providing (a) an additional synapse including an additional semiconductor layer and an additional ferroelectric layer, the additional semiconductor layer being monolithic; (b) an additional first gate including additional first gate portions, an additional second gate including additional second gate portions, and an additional third gate including additional third gate portions; (c) wherein the additional semiconductor layer is between the additional first gate portions, the additional semiconductor layer is between the additional second gate portions, and the additional semiconductor layer is between the additional second gate portions; supplying a first signal to the first gate, a second signal to the second gate, and a third signal to the third gate; writing a variable resistance to the semiconductor layer in response to supplying the first signal to the first gate, the second signal to the second gate, and the third signal to the third gate, wherein the variable resistance is a weight for the synapse; supplying an additional first signal to the additional first gate, an additional second signal to the additional second gate, and an additional third signal to the additional third gate; writing an additional variable resistance to the additional semiconductor layer in response to supplying the additional first signal to the additional first gate, the additional second signal to the additional second gate, and the additional third signal to the additional third gate, wherein the additional variable resistance is an additional weight for the additional synapse; in response to writing the variable resistance and the additional variable resistance, supplying an input current to the semiconductor layer and supplying an additional input current to the additional semiconductor layer with the additional weight; in response to supplying the input current and the additional input current, supplying an output current from the semiconductor layer to an third layer and supplying an additional output current from the additional semiconductor layer to the third layer; at the additional layer, summing the output current with the additional output current to form a summed current; supplying the summed current to an analog circuit; and performing a non-linear function on the summed current with the analog circuit.

Example 24a

The method of example 23 comprising supplying a supplemental first signal to the first gate, a supplemental second signal to the second gate, and a supplemental third signal to the third gate; writing a supplemental variable resistance to the semiconductor layer in response to supplying the supplemental first signal to the first gate, the supplemental second signal to the second gate, and the supplemental third signal to the third gate, wherein the supplemental variable resistance is a supplemental weight for the synapse; wherein the weight is unequal to the supplemental weight; wherein the weight is unequal to 0 and the supplemental weight is unequal to zero.

Example 25a

An apparatus comprising: a substrate including a surface defined by a plane; a synapse including (a)(i) a pillar having a semiconductor layer and a ferroelectric layer; (a)(ii) first and second memory cells positioned along the pillar; wherein (b)(i) the pillar is substantially orthogonal to the plane, and (b)(ii) the first memory cell includes a first gate and first portions of the semiconductor and ferroelectric layers and the second memory cell includes a second gate and second portions of the semiconductor and ferroelectric layers; an additional synapse including (a)(i) an additional pillar having an additional semiconductor layer and an additional ferroelectric layer; (a)(ii) additional first and second memory cells positioned along the additional pillar; wherein (b)(i) the additional pillar is substantially orthogonal to the plane, and (b)(ii) the additional first memory cell includes an additional first gate and additional first portions of the additional semiconductor and additional ferroelectric layers and the additional second memory cell includes an additional second gate and additional second portions of the additional semiconductor and additional ferroelectric layers; wherein the semiconductor layer is to have a resistance based on memory states of the first and second memory cells and the additional semiconductor layer is to have an additional resistance based on additional memory states of the additional first and second memory cells.

Example 26a

The apparatus of example 25 comprising a layer to sum an output current from the semiconductor layer with an additional output current from the additional semiconductor layer.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
    a first layer and a second layer;
    a first gate including first gate portions and a second gate including second gate portions;
    wherein the first layer: (a) is monolithic, (b) is between the first gate portions and is also between the second gate portions, and (c) includes a semiconductor material;
    wherein the second layer: (a) is between the first layer and at least one of the first gate portions and is also between the first layer and at least one of the second gate portions, and (b) includes oxygen and at least one of hafnium, silicon, yttrium, zirconium, barium, titanium, lead, or combinations thereof;
    wherein (a) a first plane intersects the first gate portions and the first and second layers, (b) a second plane intersects the second gate portions and the first and second layers, and (c) the first gate portions are monolithic with each other and the second gate portions are monolithic with each other;
    wherein (a) the first layer is included in a synapse, and (b) a weight of the synapse is based on a resistance of the first layer;
    wherein the resistance is a variable resistance configured to vary in magnitude of resistance in response to: (a) a first signal to be applied to the first gate, and (b) a second signal to be applied to the second gate;
    wherein (a) the variable resistance is further configured to include a number of resistance levels; and (b) the number of resistance levels is proportional to a total number of gates corresponding to the first layer.

2. The apparatus of claim 1 comprising:
    an additional first layer and an additional second layer;
    an additional first gate including additional first gate portions and an additional second gate including additional second gate portions;
    wherein the additional first layer: (a) is monolithic, (b) is between the additional first gate portions and is also between the additional second gate portions, and (c) includes the semiconductor material;
    wherein the additional second layer: (a) is between the additional first layer and at least one of the additional first gate portions and is also between the additional first layer and at least one of the additional second gate portions, and (b) includes oxygen and the at least one of hafnium, silicon, yttrium, zirconium, barium, titanium, lead, or combinations thereof;
    wherein (a) the first plane intersects the additional first gate portions and the additional first and additional second layers, and (b) the second plane intersects the additional second gate portions and the additional first and additional second layers;
    wherein the first layer is not monolithic with the additional first layer.

3. The apparatus of claim 2 comprising a third layer, wherein the third layer: (a) includes a metal; and (b) is coupled to the first layer and the additional first layer.

4. The apparatus of claim 3 comprising a switching device having a node coupled to the first layer.

5. The apparatus of claim 4 comprising an amplifier, the amplifier including a node coupled to the third layer.

6. The apparatus of claim 4 comprising an analog circuit, wherein the analog circuit:
    includes a node coupled to the third layer; and
    is configured to apply a non-linear function to an output from the third layer.

7. The apparatus of claim 5 wherein the additional first layer is included in an additional synapse.

8. The apparatus of claim 7 wherein an additional weight of the additional synapse is based on an additional resistance of the additional first layer.

9. The apparatus of claim 8 comprising a neuron corresponding to the synapse, the neuron including the amplifier.

10. The apparatus of claim 9 wherein the neuron includes the third layer.

11. The apparatus of claim 3 wherein the third layer is configured to combine output current from the first layer with additional output current from the additional first layer.

12. The apparatus of claim 2 comprising:
a supplemental first layer and a supplemental second layer;
a supplemental first gate including supplemental first gate portions and a supplemental second gate including supplemental second gate portions;
wherein the supplemental first layer: (a) is monolithic, (b) is between the supplemental first gate portions and is also between the supplemental second gate portions, and (c) includes the semiconductor material;
wherein the supplemental second layer: (a) is between the supplemental first layer and at least one of the supplemental first gate portions and is also between the supplemental first layer and at least one of the supplemental second gate portions, and (b) includes oxygen and the at least one of hafnium, silicon, yttrium, zirconium, barium, titanium, lead, or combinations thereof;
wherein (a) the first plane intersects the supplemental first gate portions and the supplemental first and supplemental second layers, and (b) the second plane intersects the supplemental second gate portions and the supplemental first and supplemental second layers;
wherein the first layer is not monolithic with the supplemental first layer;
wherein (d)(i) the first gate and the additional first gate are configured to operate simultaneously, and (d)(ii) the first gate and the supplemental first gate are configured to operate non-simultaneously.

13. The apparatus of claim 1, wherein (a) the first gate is included in a first memory cell that has no more than two possible memory states, (b) the second gate is included in a second memory cell that has no more than two possible memory states, and (c) the first and second memory cells are in series with one another.

14. The apparatus of claim 1, wherein (a) the first gate is included in a first memory cell that has at least three possible memory states, and (a) the second gate is included in a second memory cell that has at least three possible memory states.

15. The apparatus of claim 1 wherein the second layer is monolithic.

16. The apparatus of claim 1 wherein:
the first gate is included in a first memory cell and the second gate is included in a second memory cell;
the first and second gates are configured to simultaneously write a first memory state to the first memory cell and a second memory state to the second memory cell.

17. The apparatus of claim 1 comprising:
an integrated circuit on a first die, the integrated circuit including the first layer;
a memory on a second die;
the first die and the second die both on a package substrate.

18. The apparatus of claim 17 wherein the integrated circuit comprises a field programmable gate array (FPGA).

19. The apparatus of claim 1 wherein within the first plane the second layer surrounds the first layer.

20. The apparatus of claim 1 wherein the first gate is not a floating gate and the second gate is not a floating gate.

* * * * *